United States Patent [19]
Takahashi

[11] Patent Number: 5,999,470
[45] Date of Patent: *Dec. 7, 1999

[54] SENSE AMPLIFIER CIRCUIT HAVING HIGH SPEED OPERATION

[75] Inventor: Hiroyuki Takahashi, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/898,113

[22] Filed: Jul. 22, 1997

[30] Foreign Application Priority Data

Jul. 31, 1996 [JP] Japan .................................. 8-201632

[51] Int. Cl.⁶ ...................................................... G11C 7/00
[52] U.S. Cl. ........................... 365/207; 365/202; 365/208
[58] Field of Search .............................. 365/207, 189.05, 365/202, 208

[56] References Cited

U.S. PATENT DOCUMENTS

| | | | |
|---|---|---|---|
| 4,910,713 | 3/1990 | Maddem et al. ..................... | 365/207 X |
| 4,922,461 | 5/1990 | Hayakawa et al. .................. | 365/207 X |
| 5,325,335 | 6/1994 | Ang et al. ............................ | 365/203 X |
| 5,650,971 | 7/1997 | Longway et al. ....................... | 365/207 |
| 5,687,127 | 11/1997 | Takahashi ........................... | 365/207 X |
| 5,708,607 | 1/1998 | Lee et al. ............................. | 365/207 X |

OTHER PUBLICATIONS

Teruo Seki, et al. "A 6–ns 1–Mb CMOS SRAM with Latched Sense Amplifier", *IEEE Journal of Solid–State Circuits*, vol. 28, No. 4, Apr. 1993, pp. 478–482.

*Primary Examiner*—Do Hyun Yoo
*Attorney, Agent, or Firm*—Whitham, Curtis & Whitham

[57] ABSTRACT

A sense amplifier circuit is disclosed which has an amplifier circuit stage 11 outputting a intermediately signal S and SB having a first level voltage which makes a driver circuit M7 and M8 of the output circuit stage 12 into turn off when the sense amplifier circuit SA1 is in a inactive state. As a result, circuits which bring the driver circuit to a high impedance state can be unnecessitated. Accordingly, load capacities added to the output nodes A and B of the amplifier circuit stage 11 can be reduced to realize an operation of high speed, and markedly reduce the number of circuit elements.

11 Claims, 11 Drawing Sheets

SENSE AMPLIFIER CIRCUIT HAVING HIGH SPEED OPERATION

BACKGROUND OF THE INVENTION

1. Field of the Invention

The present invention relates to a sense amplifier circuit used in a semiconductor memory device, and more particularly to a sense amplifier circuit aimed at high speed operation.

2. Description of the Related Art

The sense amplifier circuit used in the semiconductor memory device exists a variety of circuit configurations corresponding to its object. This invention relates to a sense amplifier circuit aimed at high speed operation suitable for a static random access memory (SRAM). Referring to the circuit disclosed in IEEE Journal of Solid-State Circuits, Vol. 28, No. 4, 1993, pp. 478–482, and illustrated in FIG. 11, the prior art sense amplifier circuit will be described in the following. For the purpose of obtaining high speed operation and reducing the number of circuit elements, the amplification is arranged to be accomplished in one stage. A memory cell array MARY is formed by arranging a memory cell CELL at each intersection of a matrix formed by a plurality of word lines WL and digit line pairs D and DB, and only signals selected from among the plurality of digit line pairs are transmitted to read buses B and BB. The selection of plural digit line pairs is accomplished by control signals SEL1–SELn corresponding to the accessed address values, generated by an address decoder (not shown) for switching circuits YSW. The read buses B and BB serve as inputs to a sense amplifier circuit SA2. Amplified sense amplifier output signal 113 passes through a data bus WRB and an output buffer OBuff, and is output from an output terminal Dout as a read data.

Figure 11:
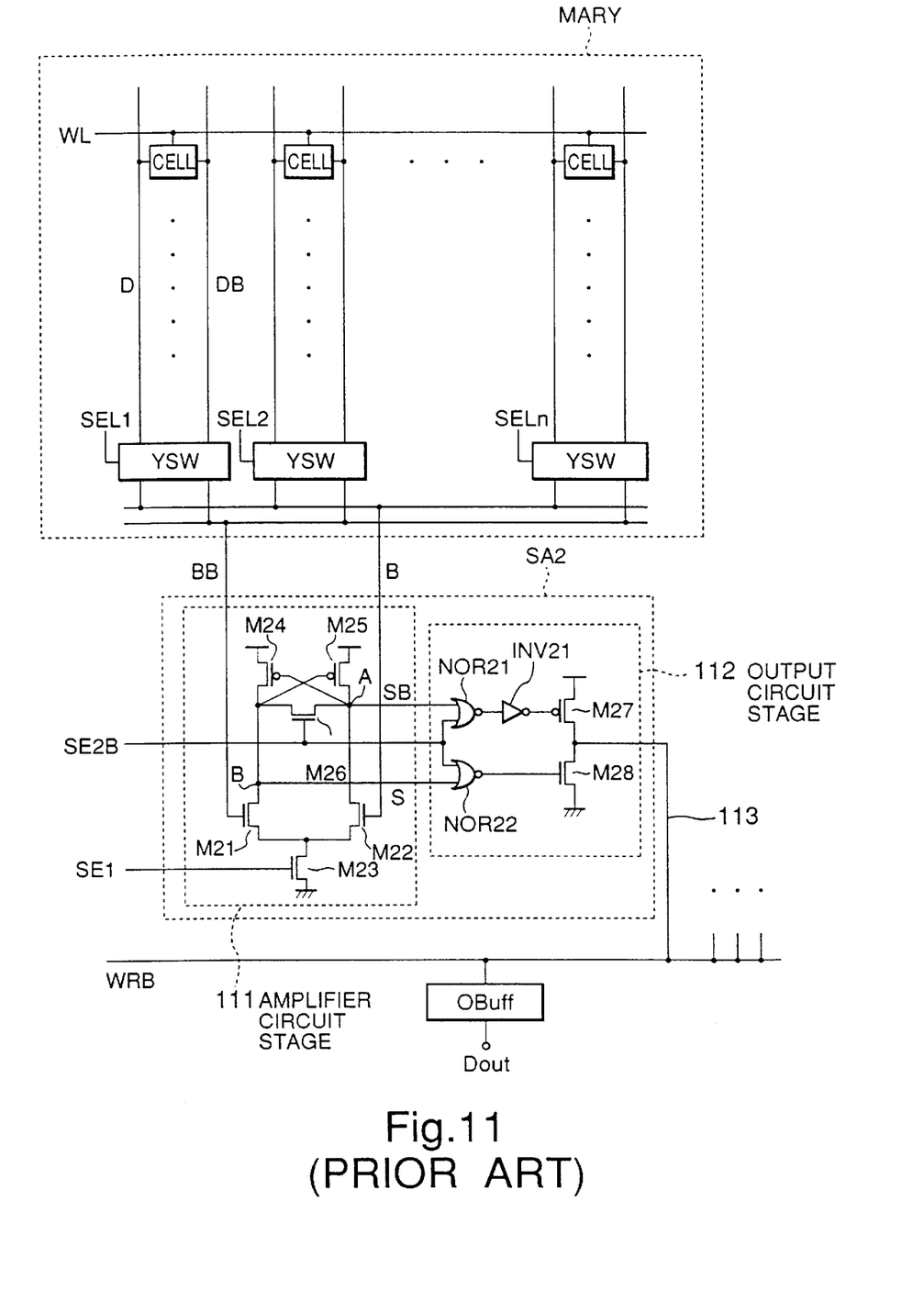
FIG. 11 is a circuit diagram of a sense amplifier circuit according to the prior art.

The sense amplifier circuit SA2 consists of an amplifier circuit stage 111 and an output circuit stage 112. When signals are input from the read buses B and BB, the amplifier circuit stage 111 outputs intermediately amplified signals S and SB to the output circuit stage 112, and the output circuit stage 112 outputs a sense amplifier output signal 113 for driving the data bus WRB based on the intermediately amplified signals S and SB. Describing the configuration of the sense amplifier circuit in detail, pMOS transistors M24 and M25, having their respective gates and drains connected in a cross coupled manner, are connected as the loads to respective drains of nMOS transistors M21 and M22, which receive the signals of the read buses BB and B, respectively, to their gates. The common drain terminal of the transistor M21 and the transistor M24 is served as the intermediately amplified signal S, and the common drain terminal of the transistor M22 and the transistor M25 is serves as the intermediately amplified signal SB. An nMOS transistor M23 which receives a control signal SE1 to its gate is inserted between the common source terminal of the transistors M21 and M22 and a minimum power supply potential (GND) line, and an nMOS transistor M26 for equalizer which receives a control signal SE2B to its gate is inserted between output terminals (nodes A and B) of the amplifier circuit stage 111. The output of a NOR circuit 21 which receives the intermediately amplified signal SB and the control signal SE2B is inverted by an inverter INV21 and serves as the gate input to a pMOS driver transistor M27, and the output of a NOR circuit 22 which receives the intermediately amplifies signal S and the control signal SE2B is input to the gate of an nMOS driver transistor M28. These transistors M27 and M28 are connected in a CMOS inverter fashion, and the signal of their common drain terminal is output to the data bus WRB as the sense amplifier output signal 113.

Next, the operation of this circuit will be described. A memory cell connected to a selected word line WL draws a current from one of the digit line pair D and DB so that there is generated a potential difference between these digit lines. This potential difference serves as memory cell information. Next, information in a selected memory cell is transmitted to the read buses B and BB by turning one of the switch circuits YSW on and turning off the others. This information is amplified by the sense amplifier circuit SA2.

The sense amplifier circuit SA2 takes on three kinds of operating states, namely, inactive, standby, and active states depending upon the combination of the control signals SE1 and SE2B.

The inactive state is one in which the control signal SE1 is at a low level and the control signal SE2B is at a high level. In this case, since the transistor M23 which receives the control signal SE1 to the gate is turned off, the differential amplifier constituted of the transistors M21 and M22 is inactive. In addition, the equalizer transistor M26 is turned on by the control signal SE2B, and the potentials of the nodes A and B which are the output terminals of the amplifier circuit stage 111 are raised up to the vicinity of (Vcc−Vth).

The standby state is one in which both control signals SE1 and SE2B are at high levels, which is a sort of an active state. In this case, currents are supplied to the transistors M21 and M22 since the transistor M23 is turned on. Moreover, the equalizer transistor M26 is also turned on so that the potentials on the nodes A and B move toward the intermediate potential (Vcc/2). By precharging the nodes A and B to the intermediate potential in this way, the differential amplifier is made to operate at a high speed. Furthermore, in the inactive state and the standby state, the NOR circuits 21 and 22 of the output circuit stage 112 are outputting low level signals all the time corresponding to the high level of the control signal SE2B. Since the output of the NOR circuit 21 is connected to the inverter circuit INV21, both driver transistors M27 and M28 are turned off, and the sense amplifier output signal 113 is in a high impedance state.

The active state is one in which the control signal SE1 is at a high level and the control signal SE2B is at a low level. When the potential difference of the memory cell information (namely, the potential difference between the read buses B and BB) read out of the memory cell is expanded to some extent, the equalization of the potentials of the nodes A and B is released by bringing the control signal SE2B to a high level. Consequently, the differential amplifier is actuated and intermediately amplified signals S and SB are output to the nodes A and B. The potential difference generated between the nodes A and B is fed back to the respective gates of the load transistors M24 and M25, and is further expanded. Moreover, the NOR circuits 21 and 22 of the output circuit stage 112 are made effective corresponding to the low level of the control signal SE2B, and one of the driver transistors M27 and M28 is turned on depending upon the positive and negative polarities of the intermediately amplified signals S and SB, and the sense amplifier output signal 113 is output to the data bus WRB.

As described in the above, the sense amplifier circuit SA2 brings the sense amplifier signal 113 to a high impedance state in the states other than that which produces the output signal 113. In other words, it forms a tristate circuit, and it maintains the information on the data bus WRB when the output signal 113 is not output.

In the conventional circuit, invalidation of the amplification operation of the amplifier circuit stage 111 and sending of the sense amplifier signal 113 to a high impedance state are synchronized by providing the NOR circuits 21 and 22 which receive the control signal SE2B in the output circuit stage 112. Accordingly, the driver transistors M27 and M28 are turned off without fail by the use of the control signal SE2B the NOR circuits regardless of the equalizing potentials of the nodes A and B.

In the conventional circuit, the number of elements is reduced by constituting the sense amplifier circuit in one stage. However, since the potential difference between the input signals (signals on the read buses B and BB) to the sense amplifier circuit is small, a large output amplitude cannot be obtained unless the output signals of the amplifier circuit stage 111 are fed back to the load transistors M24 and M25. What is important in this feed back path is the response speed of the output terminals (nodes A and B) of the amplifier circuit stage 111. Since this response speed becomes the reaction speed for applying a feedback to the gain of the differential amplifier, the load capacities added to the nodes A and B are preferably small in order to realize a high speed operation. However, in the conventional circuit, the load capacities are very large, and the operating speed of the amplifier circuit stage 111 is slowed down. The reason for this is that the NOR circuits 21 and 22 are connected to the nodes A and B.

Figure 12:
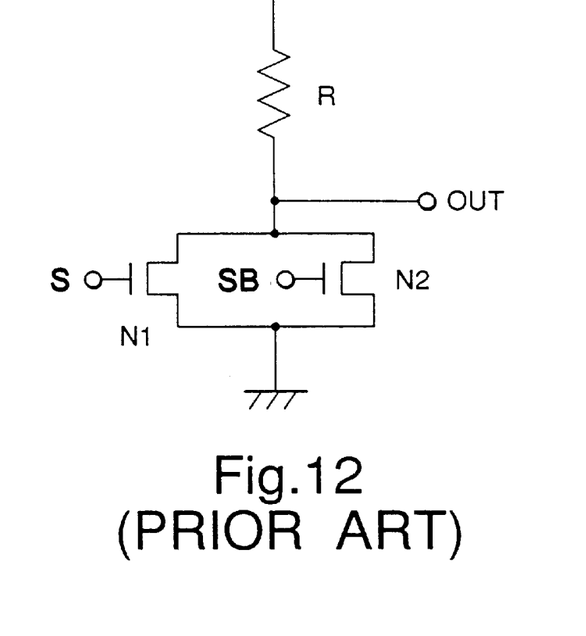
FIG. 12 is a circuit diagram of a NOR circuit in general.
Figure 13:
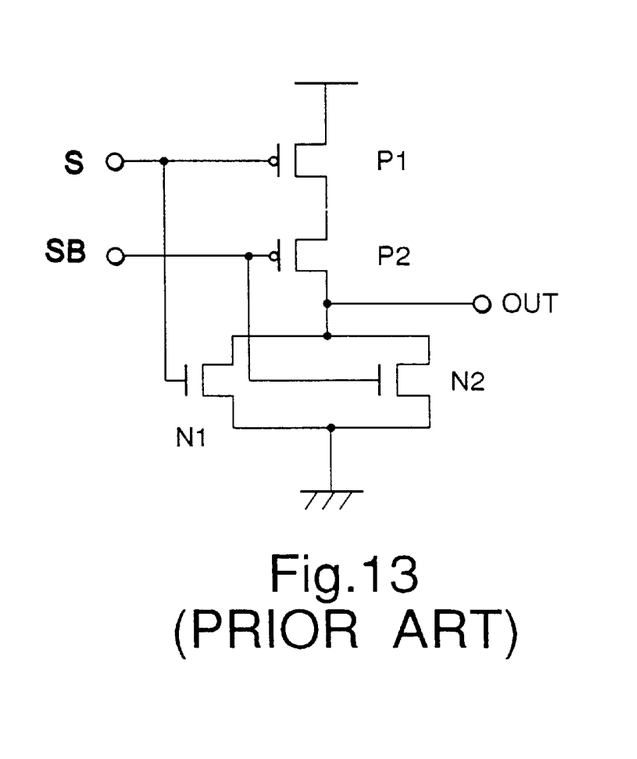
FIG. 13 is a circuit diagram of a NOR circuit of the prior art.

In general, the NOR circuit has a configuration as shown in FIG. 12. In the case of this configuration, the operating speed of the NOR circuit is determined by resistance R and the ratio of the capabilities of nMOS transistors N1 and N2. Namely, the charging rate and the discharging rate of output terminal OUT are inversely proportional with each other. Accordingly, a NOR circuit as illustrated in FIG. 13 is adopted for a sense amplifier circuit aimed at high speed operation as shown in FIG. 11. Since charging of the output terminal OUT is carried out by the power of pMOS transistors P1 and P2, and the discharging is carried out by the power of the nMOS transistors N1 and N2, its operation can be made at high speed.

However, with this configuration, the load capacities to be added to the nodes A and B of the amplifier circuit stage 111 become very large. This is due mainly to the following two reasons. Namely, one is that for balancing the charging and discharging rates the gate width of the pMOS transistor has to be made about twice as large that of the nMOS transistor of the same size because the power of the pMOS transistor is about half that of the nMOS transistor. Moreover, since pMOS transistors are connected in series to the NOR circuits, the PMOS transistors have to be made still larger in order to obtain a specified transistor power. The other is that the NOR circuits play the role of buffers for driving the driver transistors M27 and M28 which drives in turn the data bus WRB which is a long wiring, so that the size of the NOR circuits cannot be made small.

Consequently, the response speed of the nodes A and B of the amplifier circuit stage 111 is necessarily lowered. Moreover, because of the large size of the NOR circuit its performance is subject to a large variation due, for example, to dispersion in the manufacture. In order to ensure the production margin, it is necessary either to make the sense amplifier circuit two stages or to enlarge the transistor size of the amplifier circuit stage 111 which results in an increase in the current consumption. However, an integration of the semiconductor memory is recently progressing and the number of sense amplifier circuits is in an increasing trend, which makes it difficult to adopt such techniques, and the problem is becoming a large restriction on circuit design.

SUMMARY OF THE INVENTION

It is, therefore, an object of the present invention to provide a sense amplifier circuit which can operate at high speed by reducing the capacities to be added to the amplifier circuit while suppressing the number of elements constituting the circuit.

It is another object of the present invention to provide a semiconductor device equipped with the afore-mentioned sense amplifier circuit.

A sense amplifier circuit according to the present invention is featured by employing a differential amplifier circuit outputting an intermediate signal having a first level voltage which makes a driver circuit turn off when the sense amplifier circuit is in an inactive state. Here, the drive circuit receives an intermediate signal and generating an output signal which outputs to the data bus.

With the above features, the differential amplifier circuit has an equalizer circuit equalizing a electric potential of the intermediately signal. The equalizer circuit makes the potential of an intermediate signal into a stated level witch makes the output signal of the driver circuit into a high impedance when said differential amplifier circuit is in a inactive state.

Accordingly, in this invention, while building a sense amplifier circuit using an amplifier circuit stage of a single stage, the sense amplifier circuit is so constituted as to output from the amplifier circuit stage logical levels which bring the driver transistors of an output circuit stage to a high impedance state. As a result, circuits (namely, NOR circuits) which bring the driver transistors in the output circuit stage to a high impedance state can be unnecessitated. Accordingly, load capacities added to the output terminals of the amplifier circuit stage can be reduced to realize an operation of high speed, and markedly reduce the number of circuit elements.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENT

Figure 1:
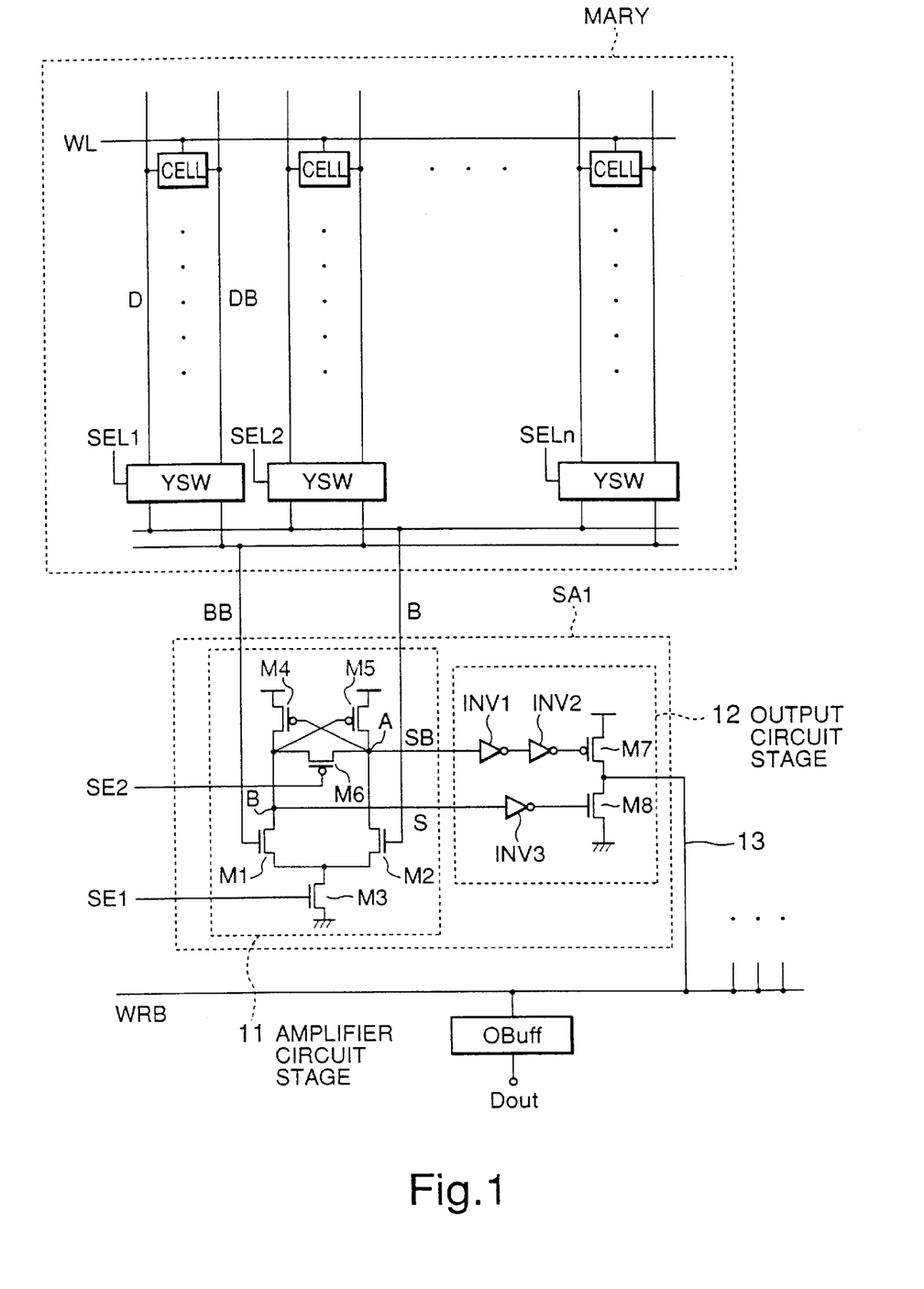
FIG. 1 is a circuit diagram of a sense amplifier circuit according to a first embodiment.

Referring now to the drawings, the embodiments of this invention will be described. FIG. 1 is a circuit diagram of a first embodiment of this invention showing a circuit configuration in which a sense amplifier formed in one stage is applied to a static memory, analogous to the prior art shown in FIG. 11. In what follows, components with the same constitution as in FIG. 11 are given the same reference numerals to omit further description. In FIG. 1, the constitution of the memory cell array MARY is the same as in FIG. 11. Accordingly, memory cell information selectively read out is input to a sense amplifier SA1 via read buses D and DB. The sense amplifier circuit SA1 generates the intermediately amplified signals S and SB in an amplifier circuit stage 11, and outputs a sense amplifier output signal 13 to the data bus WRB from an output circuit stage 12 in response to the values of the intermediately amplified signals S and SB.

The amplifier circuit stage 11 is constituted of nMOS transistors M1 and M2 forming a differential amplifier, nMOS transistors M3 serving as a current source, pMOS transistors M4 and M5 serving as loads, and a pMOS transistor M6 for equalization. The basic connection relationships of these transistors are identical to that of the amplifier circuit stage 111 of the prior art sense amplifier circuit stage SA2 shown in FIG. 11. The difference between the amplifier circuit stage 11 of this embodiment and the prior art amplifier circuit stage 111 resides in the point that the equalizer transistor is changed from the nMOS transistor M26 in the prior art to a pMOS transistor M6 in this embodiment. Consequently, the level of a control signal SE2 is opposite to that of the control signal SE2B in the prior art.

The output circuit stage 12 is constituted of inverter circuits INV1, INV2, and INV3, and driver transistors M7 and M8. The inverter circuits INV1 and INV3 receive the intermediately amplified signals SB and S, respectively, from the amplifier circuit stage 11. The driver transistors M7 and M8 constitute an inverter circuit which outputs the sense amplifier output signal 13 from a common drain terminal.

This embodiment has a significant feature in that the equalizer transistor of the amplifier circuit stage 11 is composed of a pMOS transistor M6. In this embodiment, when the sense amplifier circuit SA1 is in an inactive state, the signal for turning off the driver transistors M7 and M8 of the output circuit stage 12 is generated using the pMOS transistor M6. On the other hand, in the prior art shown in FIG. 11, the equalizer transistor M26 is used only for equalizing the potentials of the nodes A and B when the sense amplifier circuit SA2 is in the inactive state, and turn-off of the driver transistors M27 and M28 was taken care of by NOR21 and NOR22. In contrast to this, in this embodiment the equalizer transistor M6 takes care both of equalization of the potentials of the nodes A and B and turning-off of the driver transistors M7 and M8. Accordingly, NOR21 and NOR22 in the prior art can be done away with, thereby reducing the load capacities added to the nodes A and B, so that the operating speed of the sense amplifier circuit can be increased.

Here, it will be described in the circuit of the prior art in FIG. 11 that it is not possible to turn off the driver transistors M27 and M28 with only the nMOS transistor M26 for equalization. As mentioned above, in the inactive state of the sense amplifier circuit SA2 the potentials of the nodes A and B settles toward (Vcc−Vth). However, when both voltages of the source and drain of the nMOS transistor go to high potentials, it becomes difficult to keep the transistor in the onstate. More particularly, the transistor is turned off when the source potential is raised to a certain value so that the source potential and the drain potential cannot be made equal, and irregularities arise in the potentials. This causes irregularities in the potentials that appear at the nodes A and B, which leads to a possibility that logic levels for turning off the inverter circuits may not be obtained. This is the reason why NOR21 and NOR22 are provided in the prior art circuit, namely to make it possible to turn off the driver transistors M27 and M28 irrespective of the potentials of the nodes A and B.

Next, the circuit operation of this embodiment will be described. The operation of the sense amplifier circuit SA1 is controlled by control signals SE1 and SE2. Namely, the sense amplifier circuit SA1 goes to an inactive state when the control signals SE1 and SE2 are at low levels. Consequently, the potentials of the nodes A and B settle toward the potential (Vcc−Vth) similar to the prior art, where Vth is the threshold of the transistors M4 and M5. Since the transistor M6 is turned on at this time, the intermediately amplified signals S and SB are at high levels as logical levels. As a result, high level signals are input to the inverter circuits INV1 and INV3 of the output circuit stage 12, and the driver transistors M7 and M8 are turned off completely, bringing the sense amplifier output signal 13 to a high impedance state.

Next, the sense amplifier circuit SA1 is brought to a standby state by bringing the control signal SE1 to a high level while keeping the control signal SE2 at a low level. Accordingly, the transistor M3 is turned on and the transistors M1 and M2 are actuated. Therefore, the potentials of the nodes A and B move toward the intermediate potential (Vcc/2).

Subsequently, the control signal SE2 is brought to a high level while keeping the control signal SE1 at a high level to bring the sense amplifier circuit SA1 to an active state. Accordingly, the amplifier circuit stage 11 outputs intermediately amplified signals S and SB based on memory cell information input from the read buses B and BB, by which the driver transistors M7 and M8 are actuated and the sense amplifier output signal 13 is output.

Figure 2:
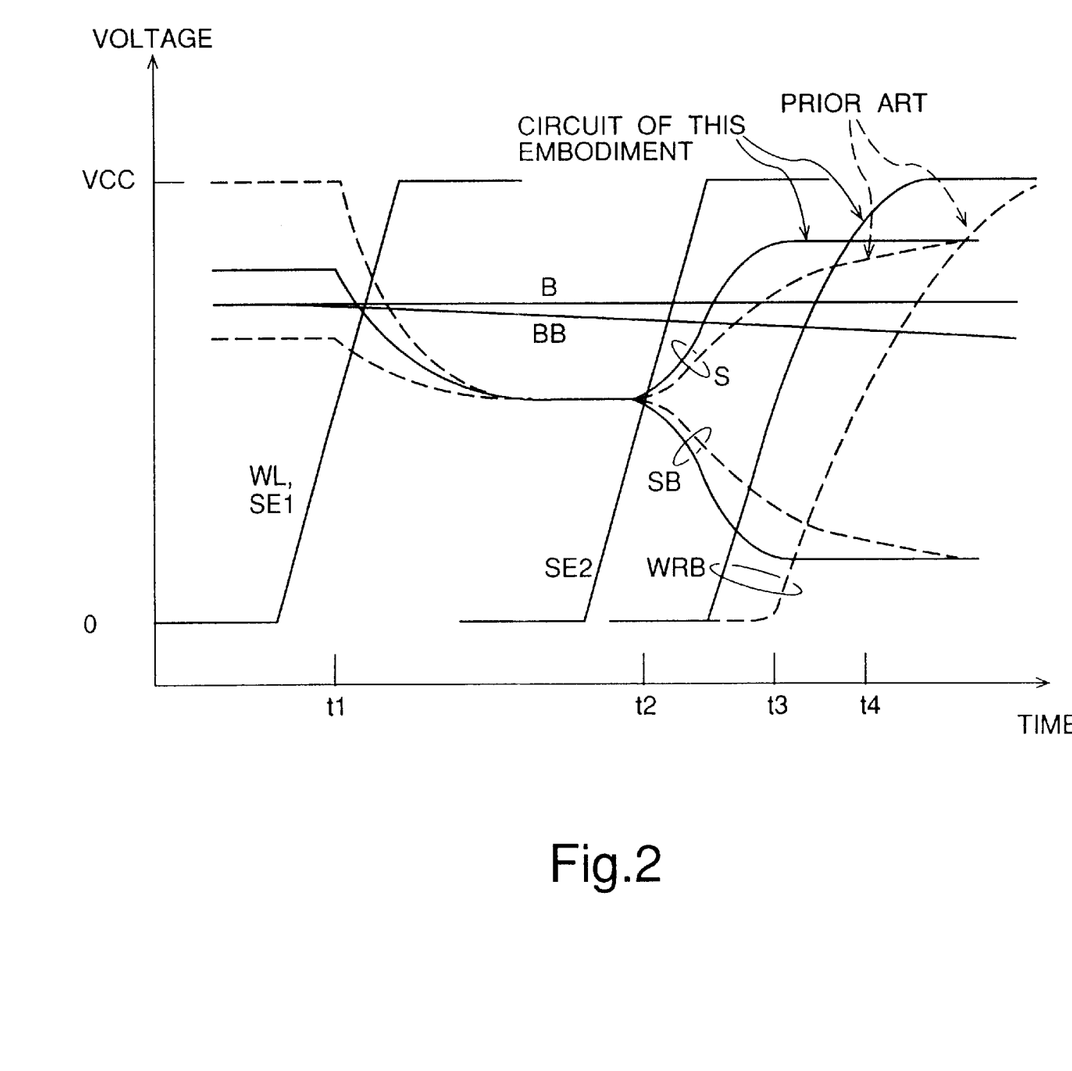
FIG. 2 is an operating characteristic diagram of the sense amplifier circuit of the first embodiment and a prior art.

Referring to FIG. 2, the operation characteristics of this embodiment and the prior art will be compared. In the figure the solid line and the broken line represent the characteristics of this embodiment and the prior art in FIG. 11, respectively. Of the timings on the abscissa, t1 and t2 indicate the timings at which the control signals SE1 and SE2, respectively, are turned on. In addition, t3 and t4 are the timings at which the logical levels of the intermediately amplified signals S and SB of this embodiment and the prior art, respectively, are determined. Here, the control signal SE2 corresponds to the inverse of the control signal SE2B in the prior art. During the period prior to the timing t1 the sense amplifier circuit is in an inactive state. A comparison of the potentials of the intermediately amplified signals S and SB shows that the signals S and SB are dispersed in the prior art, in contrast to their being at equal potential in this embodiment. When the control signal SE1 goes to a high level, the signals S and SB converge toward the intermediate potential. Namely, the period between the timings t1 and t2 is the standby state of the sense amplifier circuit. Following that, the control signal SE2 goes to high level at the timing t2, and the sense amplifier circuit goes to the active state, and hence the potential difference between S and SB is expanded. In this case, a large difference is generated in the expansion rates of the potential difference between this embodiment and the prior art. That is to say, in contrast to the potential difference being determined at the timing t3 in this embodiment, it is determined at the timing t4 in the prior art. This difference in the delay time is caused by the above-mentioned difference in the load capacities added to the nodes A and B of the amplifier circuit stage.

Figure 3:
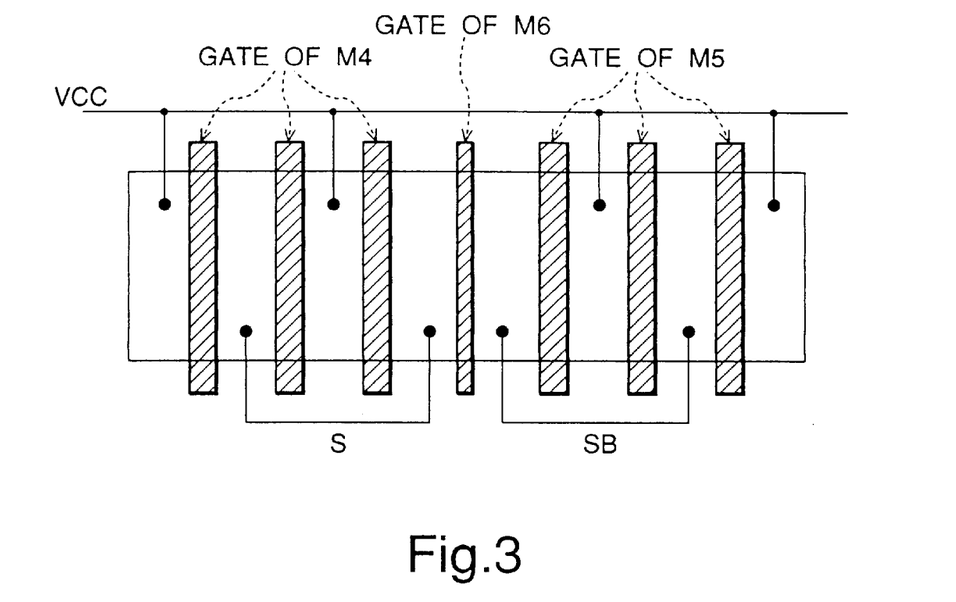
FIG. 3 is a plane layout diagram of an equalizer transistor and load transistors of the first embodiment.

In FIG. 3 is shown a schematic diagram of plane layout of the load transistors M4 and M5 and the equalizer transistor M6 of the amplifier circuit stage 11 of this embodiment. In this embodiment, by building the equalizer transistor M6 to have the same conductivity type as in the load transistors M4 and M5 it is possible to share the diffused layer of the drain terminals of these transistors. Accordingly, the load capacities of the nodes A and B are further reduced.

Figure 4:
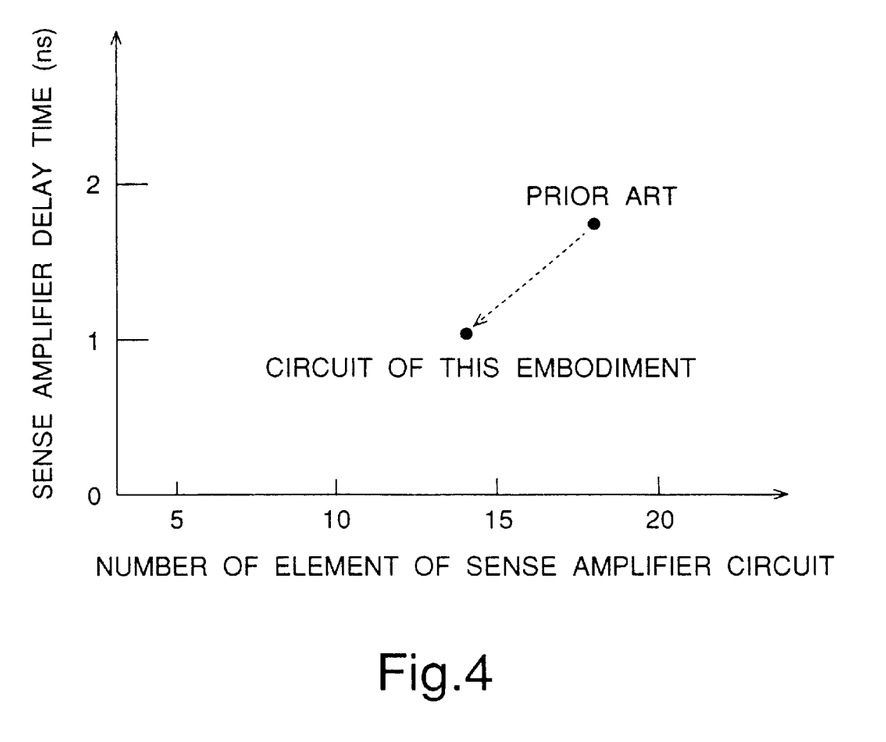
FIG. 4 is a diagram showing the relation between the element number and the operating speed of the sense amplifier circuit of the first embodiment and the prior art.

In FIG. 4 is shown the dependence of the delay time from the start of the amplification operation of the sense amplifier circuit to the output of the sense amplifier output signal to the data bus WRB on the number of transistor elements constituting the sense amplifier circuit. In the figure, circuits of the prior art and this embodiment are compared assuming an SRAM of about 1 Mbit. In this embodiment, a 40% increase in the operating speed is realized with number of elements being smaller by 22% than in the prior art. Besides the effect of a reduction in the number of elements, the loads on the source and drain of the equalizer transistor are markedly reduced, so that a high drive performance is no longer demanded of this transistor. Accordingly, the size of the equalizer transistor can be made small so that it also has an effect of reducing the layout area and the operating current.

Figure 5:
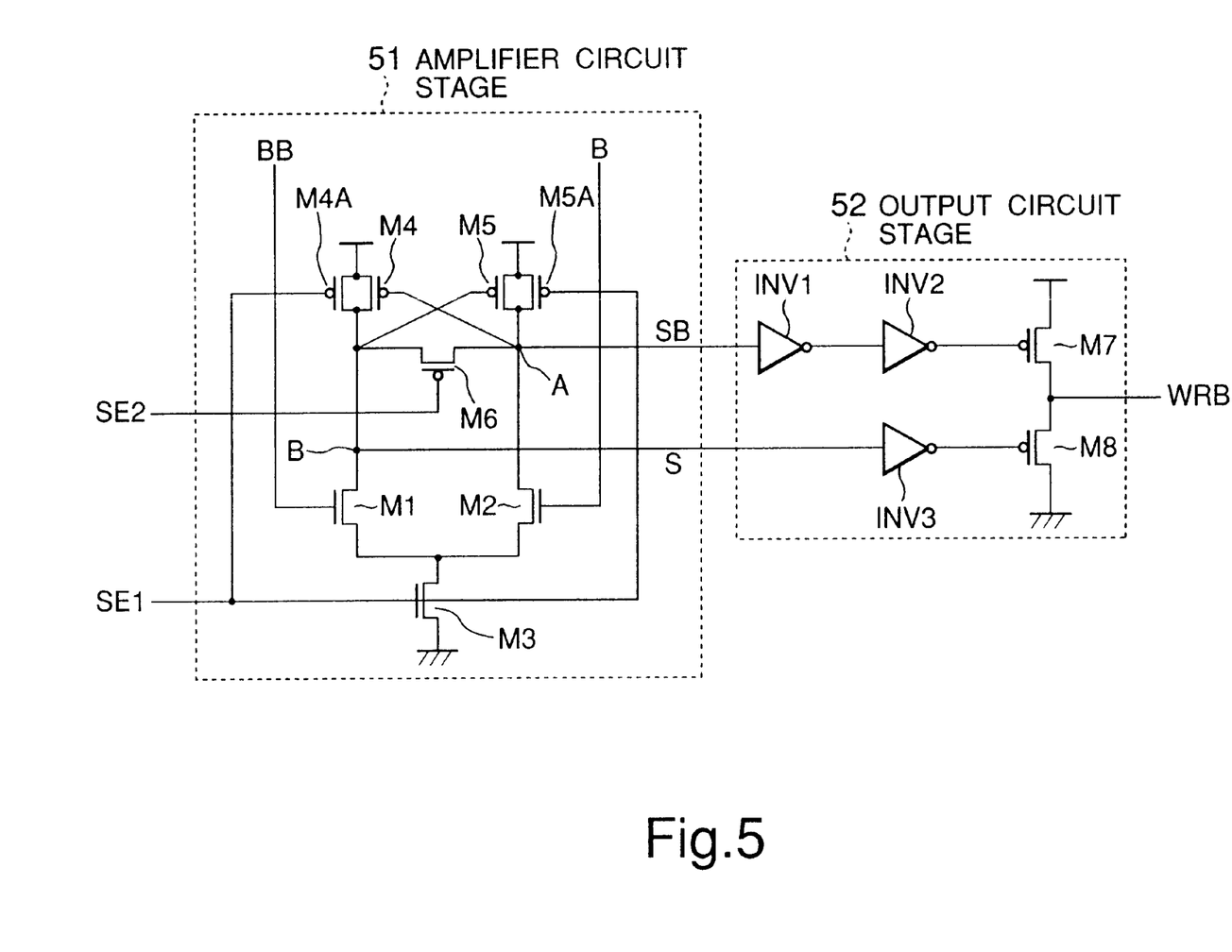
FIG. 5 is a circuit diagram of a sense amplifier circuit according to a second embodiment.

Next, referring to FIG. 5, a second embodiment of this invention will be described. In this embodiment, in contrast to the circuit of the first embodiment, pMOS transistors M4A and M5A which receive the control signal SE1 to the gates are connected in parallel to the load transistors M4 and M5. Accordingly, when the sense amplifier circuit is in an inactive state, the potentials of the nodes A and B are fixed to Vcc so that more secure logical levels can be obtained. Moreover, since the sole purpose of the transistors M4A and M5A is to raise the potentials of the transistors M4 and M5 by the amount corresponding to the threshold (about 0.7 V) of these transistors, transistors M4A and M5A having a small size can be employed. Since the increase in the capacities of the nodes A and B caused by the addition of the elements is small, the high speed of the operation can be maintained.

Figure 6:
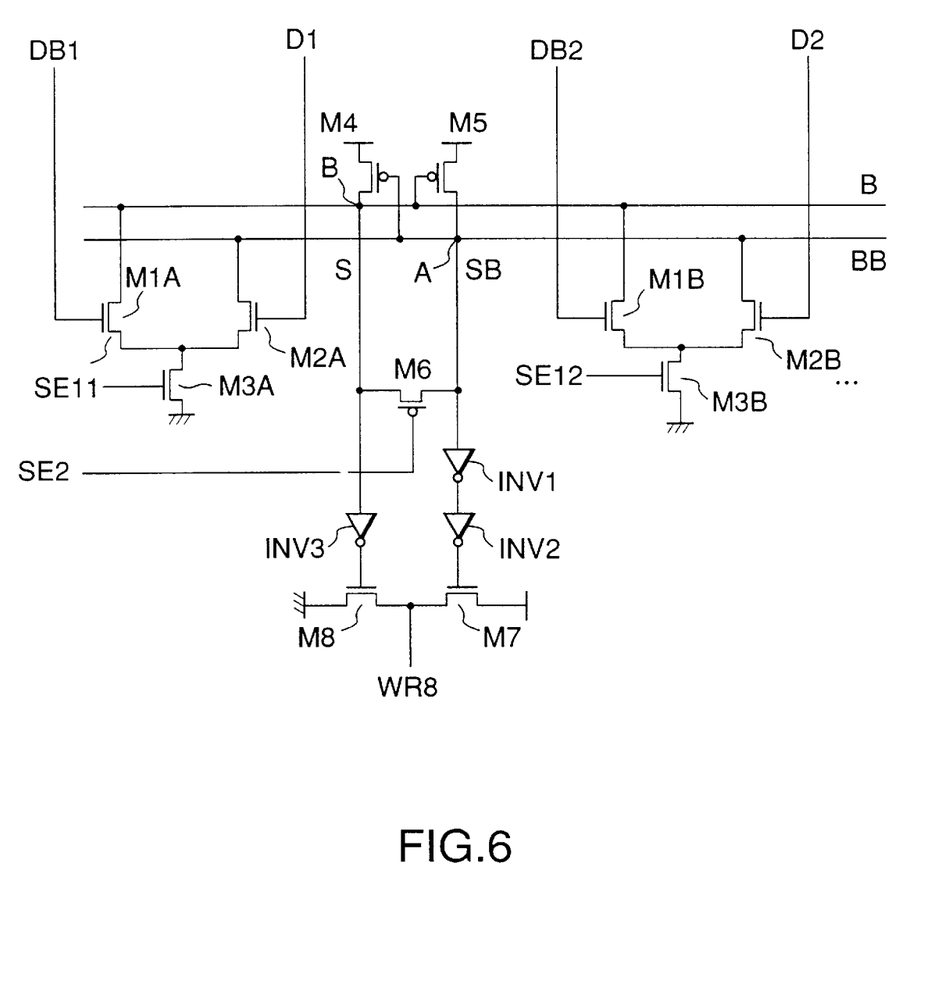
FIG. 6 is a circuit diagram of a sense amplifier circuit according to a third embodiment.

Next, referring to FIG. 6, a third embodiment of this invention will be described. In this embodiment, the switch circuits YSW for digit line selection and the sense amplifier circuit in the first embodiment are integrated. A differential amplifier is formed by nMOS transistors M2A and M1A which receive the signals of a digit line pair D1 and DB1, respectively, to the gates, and a digit line selection signal SEl1 is input to the gate of an nMOS transistor M3A connected between their common source and the ground. Similarly, a differential amplifier circuit is formed by nMOS transistors M2B and M1B which receive the signals of a digit line pair D2 and DB2 to the gates, and a digit selection signal SEl2 is input to the gate of an nMOS transistor M3B connected between their common source and the ground. These differential amplifiers are formed corresponding to a plurality of digit line pairs, and by connecting respective drains of the transistors M1A, M1B, and M2A, M2B in common, to output an intermediately amplified signal S to the read bus B and an intermediately amplified signal SB to the read bus BB. Here, since loads to be connected to these differential amplifier circuits may be commonly, pMOS transistors M4 and M5 whose gates and drains are connected in cross coupled manner are connected to these amplifier circuits. Further, the equalizer pMOS transistor M6 between the intermediately amplified signals S and SB, and the driver transistors M7 and M8 for inverter circuits INV1–INV3 have a constitution similar to the first embodiment.

In this constitution, when a digit selection signal SEl1 corresponding to the control signal SE1 in the first embodiment is selected, a differential amplifier having the potentials of the digit lines D1 and DB1 as the inputs is formed by M1A, M2A and M4, M5, and a circuit similar to that in the first embodiment is realized. Note that the drains of transistors M2B and M1B corresponding to unselected digit lines D2 and DB2 are connected to the nodes A and B as the loads. Accordingly, this embodiment is effective when applied to the case where these load capacities are small so that required speeds for the intermediately amplified signals S and SB are satisfied. In addition, the control signal SE1 used in the first embodiment may be omitted.

Figure 7:
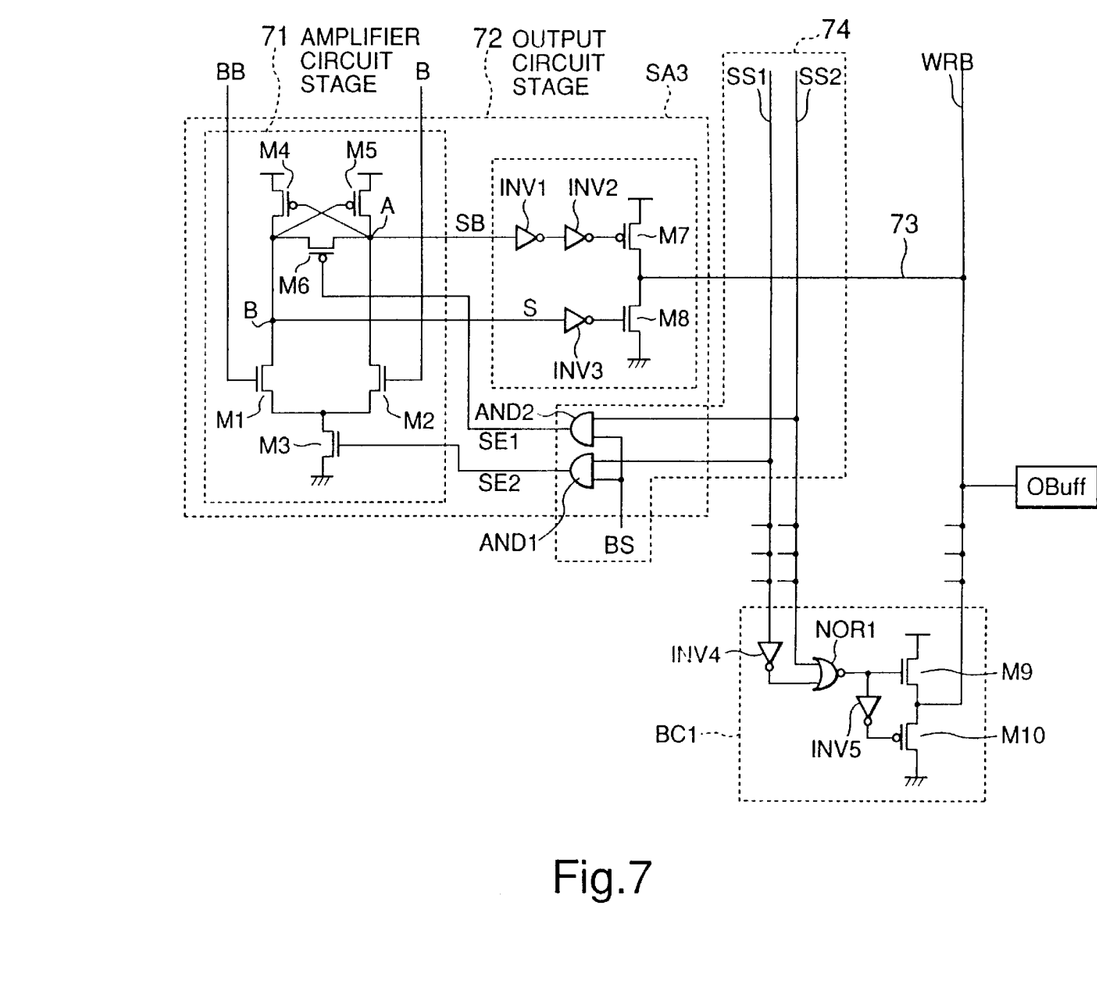
FIG. 7 is a circuit diagram of a sense amplifier circuit according to a fourth embodiment.

Next, referring to FIG. 7, a fourth embodiment of this invention will be described. In this embodiment, a circuit which improves the switching speed of the data bus WRB is installed in order to further increase the data output from the output buffer. A sense amplifier circuit SA3 of this embodiment is obtained by including a buffer part of the control signals SE1 and SE2 to the sense amplifier circuit SA1 in the first embodiment. This buffer part is constituted of AND circuits AND1 and AND2, which are selected using a block selection signal BS and which, by inputting control signals SS1 and SS2 common to all blocks, generate the control signals SE1 and SE2. A data bus potential control circuit BC1 inputs the control signals SS1 and SS2, and precharges the data bus WRB to the potential (Vcc/2) by turning on both of an nMOS transistor M9 and a pMOS transistor M10 only when the control signal SS1 is at a high level and the control signal SS2 is at a low level.

In other words, the data bus WRB is precharged only when the sense amplifier circuit is in the standby state. In this case, the source potentials of the driver transistors M9 and M10 are raised so that they are turned off in the vicinity of the intermediate potential where the gate-source potentials are close to their threshold voltage. If the data bus WRB is precharged prior to the control signal SE2 goes to a high level and the sense amplifier circuit is in the active. state, the driver transistors M7 and M8 of the sense amplifier circuit SA3 drives the sense amplifier output signal 73 from the intermediate potential. Consequently, the data determination time is markedly improved.

Figure 8:
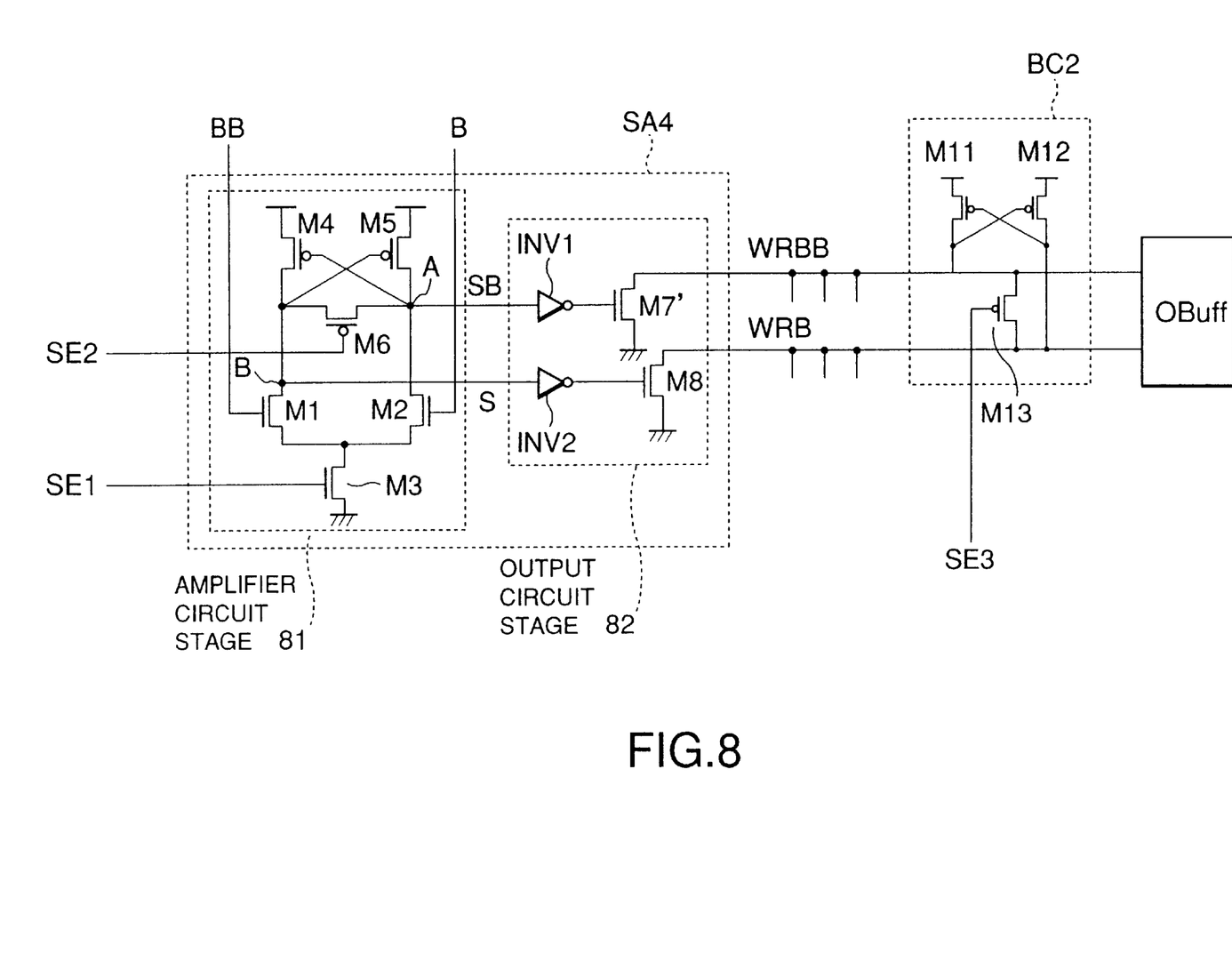
FIG. 8 is a circuit diagram of a sense amplifier circuit according to a fifth embodiment.

Next, referring to FIG. 8, a fifth embodiment of this invention will be described. In this embodiment, the data buses are constituted of two lines WRB and WRBB. These buses transmit data signals differentially to an output buffer OBuff. An output circuit stage 82 of a sense amplifier circuit SA4 of this embodiment is constituted of inverters INV1 and INV2 which receive intermediately amplified signals SB and S, respectively, from an amplifier circuit 81, and nMOS driver transistors M7' and M8 which receive the outputs of these inverter circuits. Respective drains of the driver transistors M7' and M8 are connected to the data buses WRB and WRBB to which a plurality of circuit blocks are connected in common. In addition, the data buses WRB and WRBB are provided, as a data bus load circuit BC2, with pMOS transistors M11 and M12 whose gates and drains are connected in a cross coupled manner to serve as load elements, and a pMOS transistor M13 for data bus equalization.

In this embodiment, the data buses WRB and WRBB are precharged to (Vcc−Vth) by bringing the control signal SE3 to a low level before data are output from a sense amplifier circuit SA4. The control signal SE3 is brought to a high level simultaneous with the change of the sense amplifier circuit SA4 to the activated state. Then, the driver transistors M7' and M8 pull down the potential of one of the data buses WRB and WRBB. The load transistors M11 and M12 are subjected to a feedback, and the load transistors pull up the potential of the other bus. In the case of this embodiment, the data buses WRB and WRBB are driven from the equalized state so that a high speed reading becomes possible. Besides, the data buses of this embodiment consist of two lines, but the driver transistors M7' and M8 can be built by using only nMOS transistors having small areas, and one stage of the inverter circuit is omitted. Accordingly, the operation speed of the sense amplifier circuit can be increased, and the layout area can be reduced.

Figure 9:
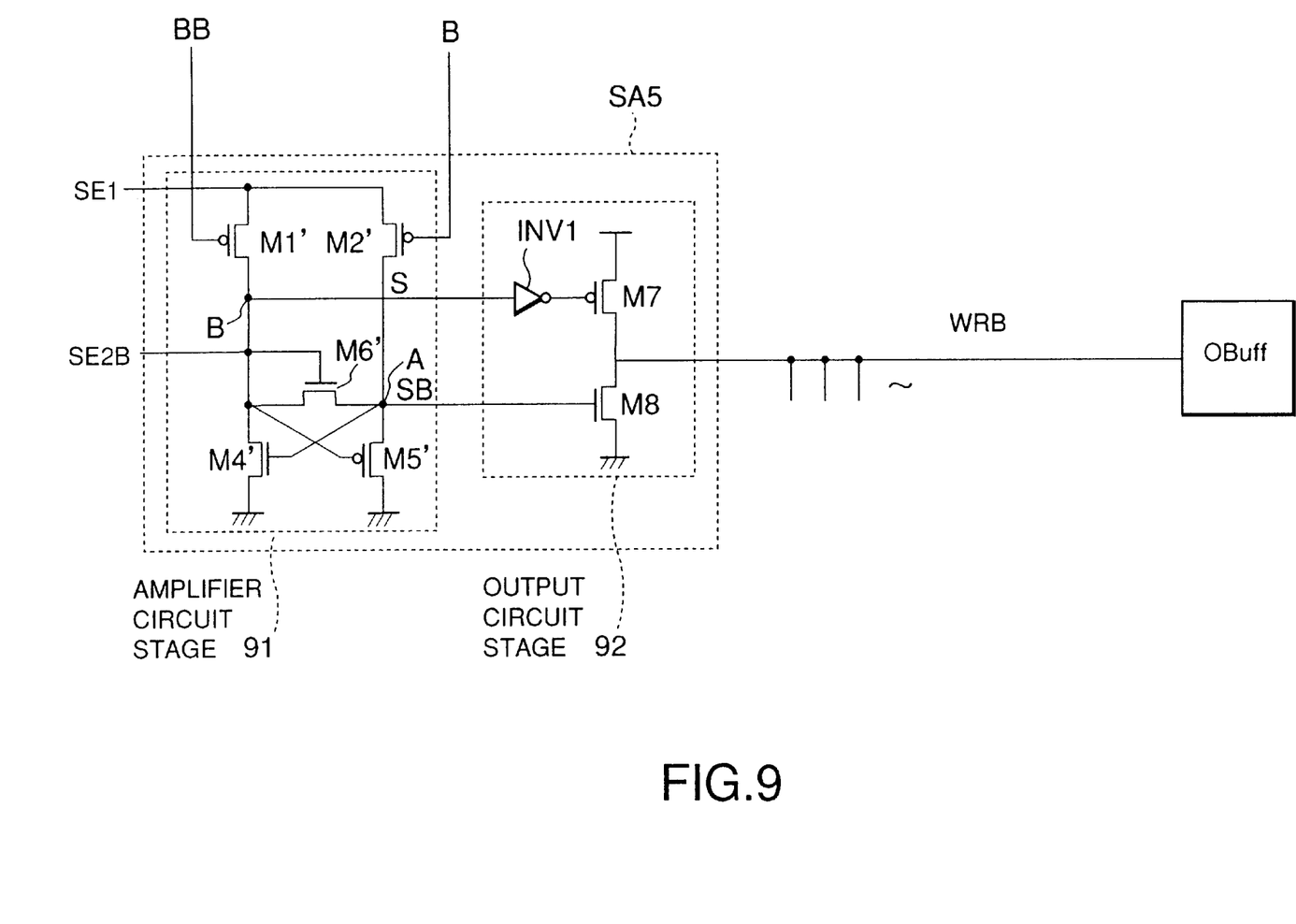
FIG. 9 is a circuit diagram of a sense amplifier circuit according to a sixth embodiment.

Next, referring to FIG. 9, a sixth embodiment of this invention will be described. In this embodiment, the conductivity types of the transistors of an amplifier circuit stage 91 of a sense amplifier circuit SA5 are opposite to those of the amplifier circuit stage 11 of the first embodiment. Namely, the read buses B and BB are connected to the gates of PMOS transistors M2' and M1', respectively. These transistors M1' and M2' form a differential amplifier and the control signal SE1 is input to the common source of these transistors. In addition, nMOS transistors M4' and M5' with their gates and drains connected in a cross coupled manner are connected as load transistors between the ground potential and respective drains of the transistors M1' and M2'. An equalizing nMOS transistor M6' is connected between the nodes A and B, and the gate of the transistor M6 receives the control signal SE2B. Therefore, the control signal SE2B corresponds to the inverted signal of the control signal SE2 of the first embodiment. Further, in an output circuit stage 92, the intermediately amplified signal S is input to the gate of the driver transistor M7 via the inverter INV1, and the intermediately amplified signal SB is input directly to the gate of the driver transistors M8.

In this embodiment, the equalizer transistor M6' is formed of an nMOS transistor. The reason for this is that when the sense amplifier circuit SA5 is in an inactive state, the potentials of the nodes A and B settle toward (GND+Vth), where GND is the ground potential and Vth is the threshold of the load transistors M4' and M5'. In this case, if the equalizer transistor M6' is formed of a pMOS transistor, it is difficult to maintain the on-state when the potential of the drain is reduced to a certain level. Accordingly, the transistor will be turned off before the potentials of the source and drain are equalized, and it is impossible to output definite logical levels to the nodes A and B. In this embodiment, the transistor performance is enhanced by forming the load transistors and the equalizer transistor with nMOS transistors, and it becomes possible to reduce the size of the transistors. As a result, the load capacities of the nodes A and B are reduced. Moreover, in the illustrated output circuit stage 92, INV2 and INV3 of the inverter circuit in the first embodiment are omitted. When the load of the data bus WRB is not too high, such a circuit configuration is also possible. In the case of this embodiment, the number of elements constituting the sense amplifier is 9, with a reduction of 5 compared with the first embodiment, and the reduction in the element number compared with the prior art is 50%.

Figure 10:
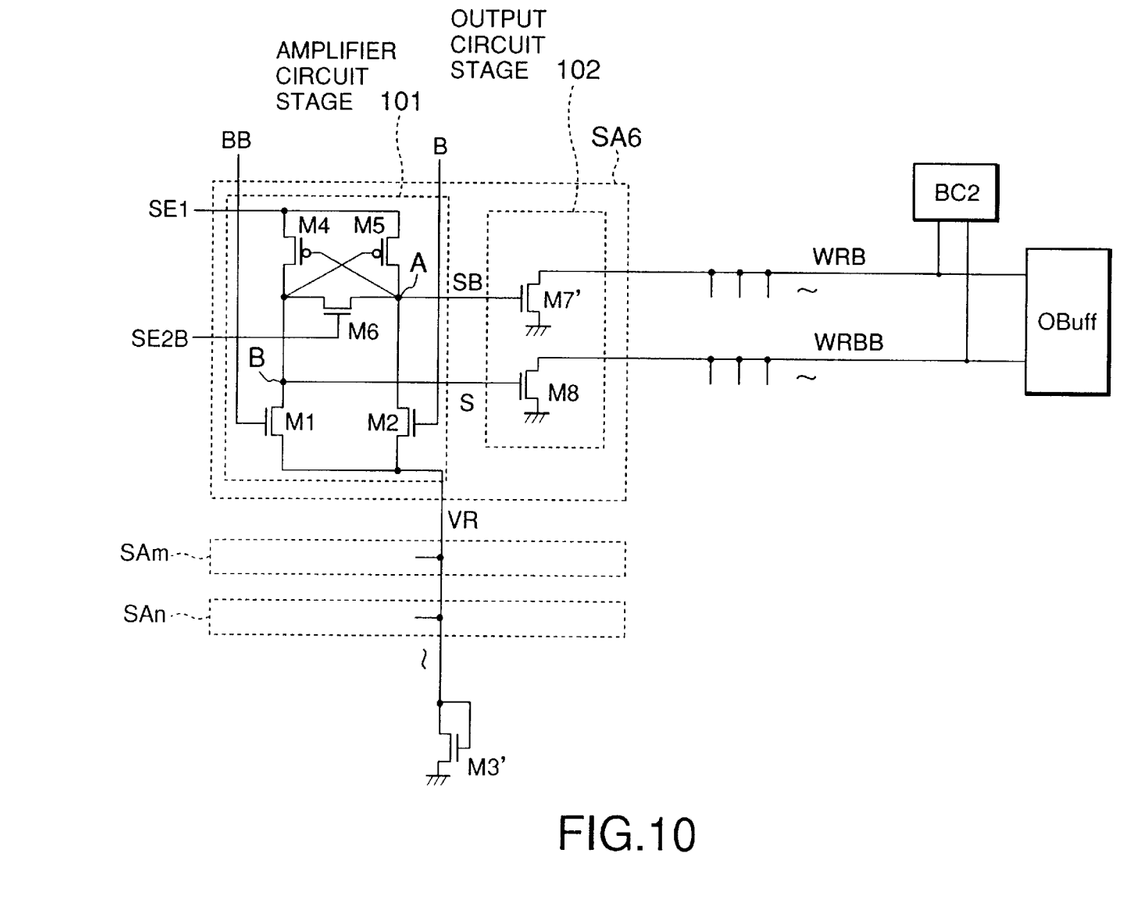
FIG. 10 is a circuit diagram of a sense amplifier circuit according to a seventh embodiment.

Next, referring to FIG. 10, a seventh embodiment of this invention will be described. In the amplifier circuit stage 101, load transistors are formed of pMOS transistors M4 and M5, an equalizer transistor is formed of an nMOS transistor M6, and a differential amplifier is formed of nMOS transistors M1 and M2. The current source of the amplifier circuit stage 101 is an nMOS transistor M3' which is turned on all the time and is connected via a potential line VR common to all blocks. The control signal SE1 is input to the common source of the load transistors M4 and M5. The control signal SE2B which corresponds to the inverted signal of SE2 of the first embodiment is input to the gate of the equalizer transistor M6. In this embodiment, the data buses consist of the two lines WRB and WRBB, the same as in the fifth embodiment, and the data bus load circuit BC2 is connected to these data buses. Furthermore, when the loads on the data buses WRB and WRBB are relatively light, the inverter circuit is omitted from the output circuit stage 102 as indicated in the figure.

In this embodiment, the equalizer transistor M6 is formed of an nMOS transistor. The reason for this is similar to the sixth embodiment in which, when the sense amplifier circuit SA5 is in an inactive state, the potentials of the nodes A and B settle toward (GND+Vth). In other words, when the sense amplifier circuit SA6 is in inactive state, the control signal SE1 is at a low level and the control signal SE2B is at a high level. Accordingly, the load transistors M4 and M5 are not turned on and the potentials of the nodes A and B settle toward (GND+Vth), where Vth is the threshold voltage of the transistor M3'. Therefore, by adopting an nMOS transistor as the equalizer transistor M6, it can be ensured to output a low level signal when the sense amplifier circuit SA6 is in inactive state. In this embodiment, the number of elements of the sense amplifier circuit SA6 is reduced to as low as seven. This element number is 39% of the prior art.

In accordance with this invention, by selecting the memory cell in response to a precharging potential of the equalizer transistor, it is possible to reduce the load capacities added to the nodes A and B which are the output terminals of an amplifier circuit stage. In other words, since equalization of the potentials of the nodes A and B is realized perfectly, it is possible to form the buffer circuit of an output circuit stage using inverter circuits only.

As in the above, according to this invention it is possible to output, from the amplifier circuit stage of the sense amplifier circuit, logical levels which can turn off the driver transistors of the output circuit stage, so that the number of inverter circuits which are buffers of the output circuit stage needs be determined in accordance with required operating speed and the loads on the data buses.

It is apparent that the present invention is not limited to the illustrated embodiment, but may be modified and changed without departing from the scope and spirit of the invention as defined in the appended claims.

What is claimed is:

1. A sense amplifier circuit operable in an active state and an inactive state, comprising:
   first and second input nodes between which an input signal to be sensed is supplied;
   a voltage line conveying an operating voltage;
   first and second output nodes;
   a control node taking an active level in response to an active level of a first control signal and an inactive level in response to an inactive level of said first control signal;
   a first transistor of a first channel type having a source-drain path connected between said control node and said first output node and a gate connected to said first input node;

a second transistor of said first channel type having a source-drain path connected between said control node and said second output node and a gate connected to said second input node;

a third transistor of a second, opposite channel type having a source-drain path operatively connected between said voltage line and said first output node and a gate connected to said second output node;

a fourth transistor of said second channel type having a source-drain path operatively connected between said voltage line and said second output node and a gate connected to said first output node; and an equalizing transistor of said second channel type having a source-drain path connected between said first and said second output nodes and a gate supplied with a second control signal which is different from said first control signal, said equalizing transistor being brought into a conductive state in response to said active level of said second control signal and a non-conductive state in response to said inactive level of said second control signal.

2. The circuit as claimed in claim 1, further comprising:

an additional voltage line conveying an additional operating voltage; and a fifth transistor of said first channel type having a source-drain path connected between said additional voltage line and said control node and a gate supplied with an additional control signal, that renders said fifth transistor non-conductive in said inactive state and renders said fifth transistor conductive in said active state.

3. The circuit as claimed in claim 2, wherein said first channel type is an N-channel type and said second channel type is a P-channel type, and said operating voltage being higher than said additional operating voltage.

4. The circuit as claimed in claim 1, wherein said first channel type is a P-channel type and said second channel type is an N-channel type, and said operating voltage is a ground level.

5. The circuit as claimed in claim 2, further comprising:

a sixth transistor of said second channel type having a source-drain path operatively connected between said voltage line and said first output node and a gate supplied with said additional control signal; and a seventh transistor of said second channel type having a source-drain path operatively connected between said voltage line and said second output node and a gate supplied with said additional control signal, and said additional control signal rendering said sixth and seventh transistors conductive in said inactive state and rendering said sixth and seventh transistors non-conductive in said active state.

6. The sense amplifier circuit as claimed in claim 1, wherein said second control signal takes said inactive level after said first control signal takes said active level.

7. The sense amplifier circuit recited in claim 1, wherein said sense amplifier circuit is capable of taking one of first to third states, said first control signal and said second control signal respectively taking said inactive level and said active level to place said sense amplifier circuit in said first state, said first control signal and said second control signal taking said active level to place said sense amplifier circuit in said second state, and said first control signal and said second control signal respectively taking said active level and said inactive level to place said sense amplifier circuit in said third state.

8. A memory circuit comprising:

a pair of first digit lines;

a pair of second digit lines;

at least one memory cell coupled to said first and second digit lines;

a pair of data bus lines; and a sense amplifier circuit including an equalizing transistor of a first channel type having a source-drain path connected between said pair of data bus lines and a gate supplied with a first control signal that renders said equalizing transistor conductive in an inactive state and non-conductive in an active state, a first power supply line conveying a first power voltage, a first transistor of said first channel type having a source-drain path operatively connected between said first power supply line and one of said data bus lines and a gate connected to the other of said data bus lines, a second transistor of said first channel type having a source-drain path operatively connected between said first power supply line and said other of said data bus lines and a gate connected to said one of said data bus lines, a second power supply line conveying a second power voltage, first and second circuit nodes, a third transistor of a second channel type having a source-drain path connected between said first circuit node and said one of said data bus lines and a gate connected to one of said first digit lines, a fourth transistor of said second channel type having a source-drain path connected between said first circuit node and said other of said data bus lines and a gate connected to the other of said first digit lines, a fifth transistor of said second channel type connected between said first circuit node and said second power supply line and supplied at its gate with a second control signal that renders said fifth transistor conductive when a first signal to be sensed appears between said first digit lines, a sixth transistor of said second channel type having a source-drain path connected between said second circuit node and said one of said data bus lines and a gate connected to one of said second digit lines, a seventh transistor of said second channel type having a source-drain path connected between said second circuit node and said other of said data bus lines and a gate connected to the other of said second digit lines, and an eighth transistor of said second channel type connected between said second circuit node and said second power supply line and supplied at its gate with a third control signal that renders said eighth transistor conductive when a second signal to be sensed appears between said second digit lines.

9. The memory circuit as claimed in claim 8, wherein said first channel type is a P-channel type and said second channel type is an N-channel type, and said first power voltage being higher than said second power voltage.

10. A sense amplifier circuit operable in an active state and an inactive state, comprising:

first and second input nodes between which an input signal to be sensed is supplied;

a voltage line conveying an operating voltage;

first and second output nodes;

a control node taking an active level in said active state and an inactive level in said inactive state;

a circuit node;

a current source connected between said circuit node and said voltage line;

a first transistor of a first channel type having a source-drain path connected between said circuit node and said first output node and a gate connected to said first input node;

a second transistor of said first channel type having a source-drain path connected between said circuit node and said second output node and a gate connected to said second input node;

a third transistor of a second channel type having a source-drain path connected between said control node and said first output node and a gate connected to said second output node, a fourth transistor of said second channel type having a source-drain path connected between said control node and said second output node and a gate connected to said first output node, and an equalizing transistor of said first channel type having a source-drain path connected between said first and said second output nodes and a gate supplied with a control signal that renders said equalizing transistor conductive in said inactive sate and renders said equalizing transistor non-conductive in said active state, wherein said current source comprises a fifth transistor of said first channel type connected between said circuit node and said voltage line and having a gate connected to said circuit node, and said operating voltage being a ground level.

11. The circuit as claimed in claim 10, wherein said first channel type is an N-channel type and said second channel type is a P-channel type.

* * * * *